US008067946B2

(12) United States Patent
Muench, Jr. et al.

(10) Patent No.: US 8,067,946 B2
(45) Date of Patent: Nov. 29, 2011

(54) METHOD FOR REPAIRING A TRANSMISSION LINE IN AN ELECTRICAL POWER DISTRIBUTION SYSTEM

(75) Inventors: Frank John Muench, Jr., Waukesha, WI (US); John Fredrick Banting, Waukesha, WI (US)

(73) Assignee: Cooper Technologies Company, Houston, TX (US)

( * ) Notice: Subject to any disclaimer, the term of this patent is extended or adjusted under 35 U.S.C. 154(b) by 443 days.

(21) Appl. No.: 11/982,587

(22) Filed: Nov. 2, 2007

(65) Prior Publication Data

US 2009/0115426 A1    May 7, 2009

(51) Int. Cl.
*G01R 31/02* (2006.01)
(52) U.S. Cl. ........................................ 324/543
(58) Field of Classification Search ............ 324/543
See application file for complete search history.

(56) References Cited

U.S. PATENT DOCUMENTS

| | | |
|---|---|---|
| 3,025,512 A | 3/1962 | Bloechl |
| 3,364,481 A | 1/1968 | Fuzzell |
| 3,460,038 A | 8/1969 | Ziegler |
| 3,700,967 A | 10/1972 | Hoss |
| 3,720,872 A | 3/1973 | Russell et al. |
| 3,725,846 A | 4/1973 | Strain |
| 3,735,248 A | 5/1973 | Reese |
| 3,816,816 A | 6/1974 | Schweitzer, Jr. |
| 3,995,243 A | 11/1976 | Malmborg |
| 4,000,462 A | 12/1976 | Boyd et al. |
| 4,037,155 A | 7/1977 | Ahmed |
| 4,045,726 A | 8/1977 | Schweitzer, Jr. |
| 4,157,520 A | 6/1979 | Moates et al. |
| 4,165,528 A | 8/1979 | Schweitzer, Jr. |
| 4,288,743 A | 9/1981 | Schweitzer |
| 4,335,437 A | 6/1982 | Wilson et al. |
| 4,384,289 A | 5/1983 | Stillwell et al. |
| 4,456,873 A | 6/1984 | Schweitzer, Jr. |
| 4,466,042 A | 8/1984 | Zylstra et al. |
| 4,495,489 A | 1/1985 | Schweitzer, Jr. |
| 4,510,476 A | 4/1985 | Clatterbuck et al. |
| 4,558,310 A | 12/1985 | McAllise |

(Continued)

FOREIGN PATENT DOCUMENTS

WO    WO 2007/143378    12/2007

OTHER PUBLICATIONS

U.S. Appl. No. 11/982,588, Banting et al.*

(Continued)

*Primary Examiner* — Jeff Natalini
(74) *Attorney, Agent, or Firm* — King & Spalding LLP

(57) ABSTRACT

The invention provides a faulted circuit indicator apparatus with transmission line state display, as well as methods for using the apparatus. The faulted circuit indicator has a sensor that can be electrically coupled to an electrical conductor for collecting data relating to a state of the electrical conductor. The faulted circuit indicator also has a controller that is logically coupled to the sensor for receiving data and determining whether a fault condition has occurred on the electrical conductor. The faulted circuit indicator also has one or more indicators that are logically coupled to the controller for indicating whether a fault condition has occurred as well as the state of the electrical conductor. The state of the conductor may be the voltage, the temperature, or the vibration present on the conductor.

10 Claims, 4 Drawing Sheets

U.S. PATENT DOCUMENTS

| | | | |
|---|---|---|---|
| 4,593,276 A | | 6/1986 | Aida et al. |
| 4,630,218 A | | 12/1986 | Hurley |
| 4,661,813 A | | 4/1987 | Mazzamauro et al. |
| 4,686,518 A | | 8/1987 | Schweitzer, Jr. |
| 4,694,599 A | | 9/1987 | Hart et al. |
| 4,739,149 A | | 4/1988 | Nishiwaki et al. |
| 4,746,241 A | | 5/1988 | Burbank, III |
| 4,794,332 A | | 12/1988 | Schweitzer, Jr. |
| 4,795,982 A | | 1/1989 | Schweitzer, Jr. |
| 4,799,005 A | | 1/1989 | Fernandes |
| 4,801,937 A | | 1/1989 | Fernandes |
| 4,847,780 A | | 7/1989 | Gilker et al. |
| 4,881,028 A | | 11/1989 | Bright |
| 4,886,980 A | | 12/1989 | Fernandes et al. |
| 4,984,124 A | | 1/1991 | Yeh |
| 5,029,039 A | | 7/1991 | Yeh |
| 5,095,274 A | * | 3/1992 | Brokaw |
| 5,155,440 A | * | 10/1992 | Huang ............................ 324/539 |
| 5,159,319 A | * | 10/1992 | Dunk et al. |
| 5,220,311 A | * | 6/1993 | Schweitzer, Jr. |
| 5,241,444 A | * | 8/1993 | Yeh |
| 5,258,903 A | * | 11/1993 | Rodriguez-Cavazos |
| 5,440,234 A | * | 8/1995 | Kondo |
| 5,475,371 A | * | 12/1995 | Dunk et al. |
| 5,485,545 A | * | 1/1996 | Kojima et al. |
| 5,497,096 A | * | 3/1996 | Banting |
| 5,537,327 A | * | 7/1996 | Snow et al. |
| 5,548,279 A | * | 8/1996 | Gaines |
| 5,559,500 A | * | 9/1996 | Kase |
| 5,574,387 A | * | 11/1996 | Petsche et al. |
| 5,576,632 A | * | 11/1996 | Petsche et al. |
| 5,629,870 A | * | 5/1997 | Farag et al. |
| 5,630,954 A | * | 5/1997 | Toth ........................ 219/130.01 |
| 5,650,728 A | * | 7/1997 | Rhein et al. ............... 324/543 |
| 5,661,626 A | * | 8/1997 | Takeuchi |
| 5,675,497 A | * | 10/1997 | Petsche et al. |
| 5,714,886 A | * | 2/1998 | Harris |
| 5,726,847 A | * | 3/1998 | Dalstein |
| 5,734,575 A | * | 3/1998 | Snow et al. |
| 5,754,383 A | * | 5/1998 | Huppertz et al. |
| 5,784,233 A | * | 7/1998 | Bastard et al. |
| 5,796,631 A | * | 8/1998 | Iancu et al. |
| 5,805,400 A | * | 9/1998 | Kim |
| 5,945,820 A | | 8/1999 | Namgoong et al. |
| 5,959,537 A | * | 9/1999 | Banting et al. |
| 6,344,748 B1 | * | 2/2002 | Gannon ........................ 324/542 |
| 6,535,797 B1 | | 3/2003 | Bowles et al. |
| 6,587,027 B1 | * | 7/2003 | Nadd ............................ 337/167 |
| 6,687,574 B2 | | 2/2004 | Pietrowicz et al. |
| 6,798,211 B1 | | 9/2004 | Rockwell et al. |
| 7,010,437 B2 | | 3/2006 | Lubkeman et al. |
| 7,282,944 B2 | | 10/2007 | Gunn et al. |
| 7,382,272 B2 | | 6/2008 | Feight |
| 7,398,097 B2 | | 7/2008 | Parkulo |
| 7,453,267 B2 | | 11/2008 | Westbrock, Jr. et al. |
| 7,495,574 B2 | | 2/2009 | Rocamora et al. |
| 7,576,548 B1 | * | 8/2009 | Lo et al. ........................ 324/543 |
| 7,692,538 B2 | | 4/2010 | Schweitzer, III et al. |
| 7,714,735 B2 | | 5/2010 | Rockwell |
| 7,733,224 B2 | | 6/2010 | Tran |
| 2002/0060556 A1 | * | 5/2002 | Wall ................................ 322/29 |
| 2005/0017751 A1 | * | 1/2005 | Gunn et al. |
| 2005/0146220 A1 | | 7/2005 | Hamel et al. |
| 2005/0151658 A1 | * | 7/2005 | Kono et al. .................... 340/647 |
| 2005/0151659 A1 | | 7/2005 | Donovan et al. |
| 2006/0063522 A1 | * | 3/2006 | McFarland |
| 2006/0187074 A1 | * | 8/2006 | O'Sullivan et al. ........... 340/660 |
| 2007/0086135 A1 | | 4/2007 | Swartzendruber et al. |
| 2007/0270114 A1 | | 11/2007 | Kesler et al. |
| 2008/0012702 A1 | | 1/2008 | Feight et al. |
| 2008/0077336 A1 | | 3/2008 | Fernandes |
| 2008/0100436 A1 | * | 5/2008 | Banting et al. |
| 2008/0284585 A1 | | 11/2008 | Schweitzer, III et al. |
| 2009/0119068 A1 | | 5/2009 | Banting |

OTHER PUBLICATIONS

U.S. Appl. No. 12/048,963, Banting et al.*
"EE's tools & toys", IEEE Spectrum, Dec. 1997, pp. 62-63.
"Fault Indicators, S.T.A.R.TM. Type ER Faulted Circuit Indicator Installation Instructions 320-60-1", Dec. 1997, Cooper Power Systems, pp. 1-2.
"Fault Indicators, S.T.A.R..TM. Faulted Circuit Indictors Electrostatic Reset Type s320-60" May 1997, Cooper Power Systems, pp. 1-4.
"Fault Indicators, S.T.A.R..TM. Type TPR Faulted Circuit Indicator Installation Instructions 320-40-1 ", Dec. 1997, Cooper Power Systems, pp. 1-3.
"Fault Indicators, S.T.A.R..TM. Faulted Circuit Indicators Test Point Reset Type s320-40", May 1997, Cooper Power Systems, pp. 1-4.
"S.T.A.R..TM. Faulted Circuit Indicators, Test Point Reset Type", Cooper Power Systems, Jan. 1998, Bulletin No. 97034.
"Fault Indicators. S.T.A.R..TM. Faulted Circuit Indicators Low Voltage Reset Type 320-50", May 1997, Cooper Power Systems, pp. 1-4.
"Fault Indicators, S.T.A.R..TM. Type LV Faulted Circuit Indicator Installation Instructions s320-50-1", Cooper Power Systems, pp. 1-4, May 1997.
"S.T.A.R..TM. Faulted Circuit Indicators, Low Voltage Reset Type", Cooper Power Systems, Jan. 1998, Bulletin No. 97035.
International Search Report and Written Opinion, issued Dec. 19, 2008 for corresponding PCT application PCT/US2008/081719 (8 sheets).

* cited by examiner

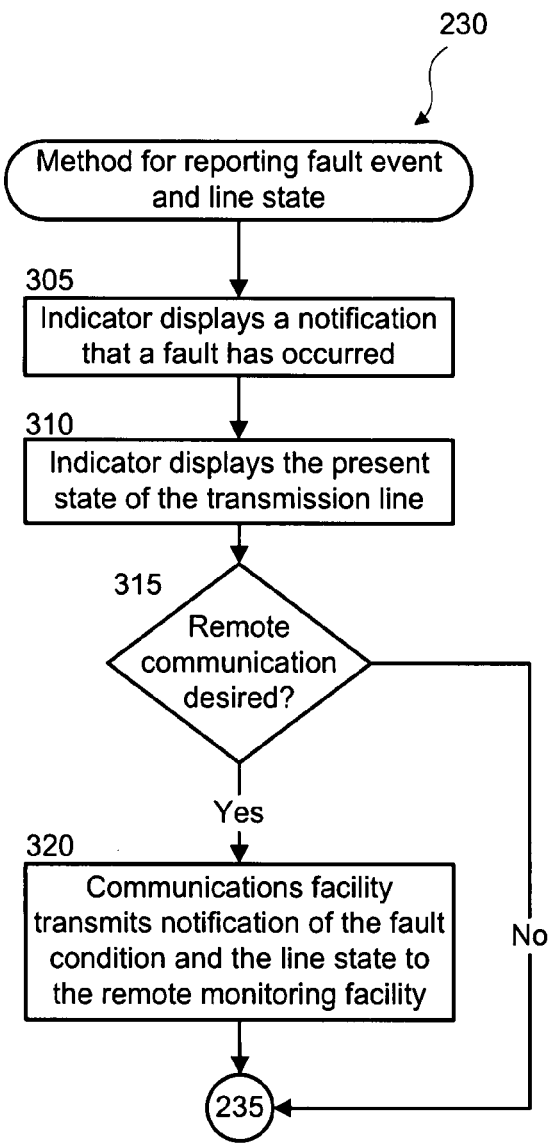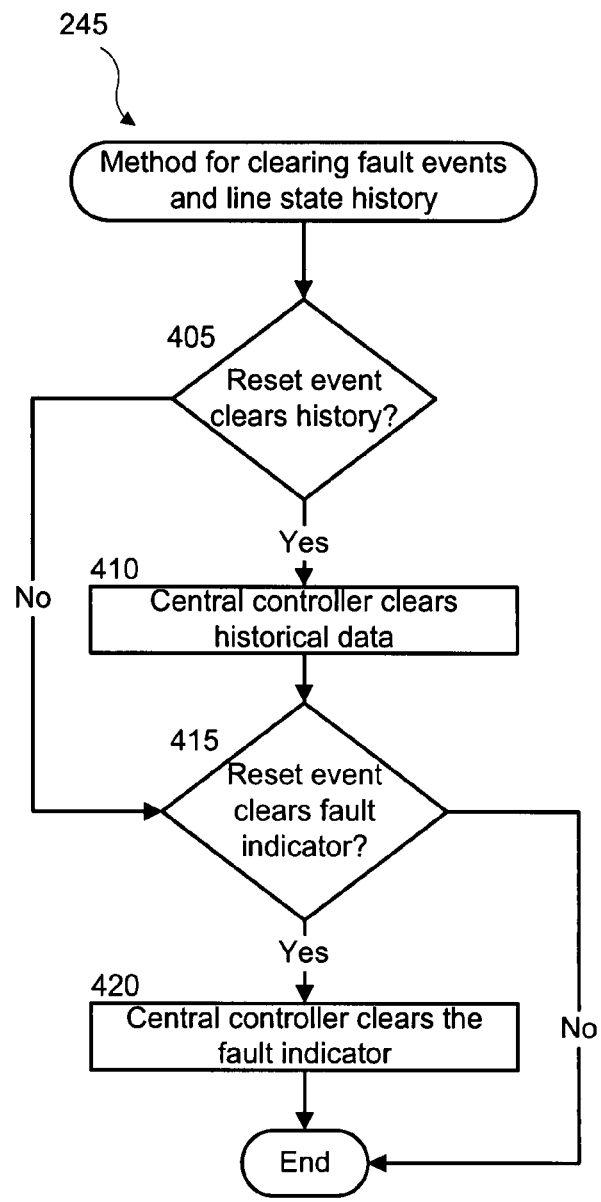
Figure 3
Figure 4

METHOD FOR REPAIRING A TRANSMISSION LINE IN AN ELECTRICAL POWER DISTRIBUTION SYSTEM

RELATED APPLICATIONS

This application is relates to U.S. patent application Ser. No. 11/982,588, entitled "Communicating Faulted Circuit Indicator Apparatus and Method of Use Thereof," filed on Nov. 2, 2007.

TECHNICAL FIELD

The present invention relates generally to faulted circuit indicators and more particularly to the communication of the state of a transmission line, including real-time or near real-time measurements of electrical current and voltage, as well as other present-state information, by the faulted circuit indicator.

BACKGROUND OF THE INVENTION

Faulted circuit indicators (FCIs) are well known in the field of electric power distribution systems. Generally, FCIs are electrically connected to transmission lines in a power distribution system at various locations throughout the system, often in close proximity to system loads. When a fault occurs in a transmission line, FCIs between the power source and the fault will detect that a fault has occurred. Typically, FCIs that have detected a fault then display an indication that the fault has been detected. A technician can then identify a fault by locating the transmission line between an FCI that indicates it has detected a fault and an FCI that displays no such indication.

Most FCIs are capable of displaying only a binary result: whether the FCI has detected a fault or not. Prior art FCIs cannot display to a technician the present state of the transmission lines to which the FCIs are attached, other than to display that a fault has passed through that line.

Modern power distribution systems may have multiple sources of electricity (or "feeds") for a particular transmission line. Simply turning off a single feed circuit to a particular portion of a transmission line may not guarantee that a particular line is de-energized. Furthermore, in some three-phase power systems, one phase may fault and trip an FCI, while the other phases remain energized. Thus, technicians must carry additional equipment to determine whether a particular transmission line is de-energized, and cannot safely rely solely on a fault indication from a prior art FCI.

Further, because of their binary nature, prior art FCIs provide little assistance in locating a transient or intermittent fault. Generally, prior art FCIs are reset either by a manual trigger, wherein a technician manually manipulates the FCI to remove the fault indication, or by a current trigger, wherein if the FCI determines that conditions on the transmission line have returned to normal, the FCI automatically resets. In the prior art, an automatic reset is a desirable feature because it ensures that the FCI only indicates existing faults, which reduces the likelihood that a false fault indication will increase the amount of time necessary for a technician to diagnose and repair an actual fault. The result of an automatic reset is, however, that an intermittent or transient fault would trigger an FCI's indicator only for a short time, followed by an immediate reset of the indicator, making the location of a faulted FCI during the presence of a faulted condition nearly impossible.

Moreover, prior art FCIs cannot monitor other conditions on a transmission line that may pose risks to the life or performance of the transmission line and other related equipment. For example, power surges at certain levels may not be sufficient to result in a fault condition that would be indicated by present FCIs, but may shorten the life of a transmission line that experiences those surges and any transformers or other equipment attached to that line. Additionally, conditions such as excess heat or vibration on a line may be indicative of a problem on a transmission line that, with the use of present FCIs, cannot be detected until a fault occurs, potentially resulting in a loss of service for customers that might have been avoided had the condition been diagnosed earlier.

Finally, when a fault occurs, the only way of determining which portion of transmission line that contains the fault is to send technicians to the general vicinity of a power outage to search for FCIs that indicate a fault. Because transmission lines are often located underground, this may require the technicians to travel from FCI to FCI on foot until the first faulted FCI is located. Thus, even with the help of FCIs, the process of locating a fault can be time consuming, resulting in increased costs to the electrical utility company servicing the fault, as well as extended periods of outages for their customers.

Prior art systems address the above problems through the use of additional equipment, such as meters, that are carried by repair and maintenance personnel working for utility companies. Unfortunately, these solutions do not address the issues of transient fault location, constant line monitoring for unfavorable conditions, or improved response time when a fault has occurred. Further, because of the need for handheld equipment, a technician must still approach a transmission line that has been indicated as faulted to determine if the line is energized, and therefore unsafe for repair work.

Accordingly, there is a need to overcome the limitations of the prior art by developing an FCI that is capable of displaying the present state of a transmission line. Beyond the need for displaying the present state of a transmission line, FCIs should also be capable of monitoring line conditions aside from simple current flow to assist in the determination of unfavorable conditions, storing historical fault and line state information to assist in the diagnosis of transient and intermittent faults, and communicating fault and line state information to a remote location to reduce the time needed to recover from a fault event.

SUMMARY OF THE INVENTION

The present invention satisfies the above-described needs by providing a faulted circuit indicator that has an indicator for indicating both the occurrence of a fault event as well as the state of an electrical conductor. The faulted circuit indicator includes a sensor for collecting data relating to the state of a conductor. The sensor is coupled to a controller for receiving the sensor data and determining whether a fault condition has occurred on the electrical conductor. The controller is further coupled to an indicator that can indicate whether a fault has occurred, and can further display the state of the electrical conductor.

The state of the electrical conductor may be the current flowing through the conductor. Alternatively, the state may be the voltage present on the conductor, the temperature of the conductor, or the vibration present on the electrical conductor. The faulted circuit indicator's display may be a numerical representation of the state of the electrical conductor, or the display may be a non-numerical representation of the state of the conductor. The indicator may display one or more states at any given time.

The faulted circuit indicator may include a memory for storing the state of the electrical conductor, a record of the fact that a fault has occurred, or both. The memory can be reset separately from an indicator that indicates a fault has occurred. The faulted circuit indicator may also include a communications facility for providing the state of the electrical conductor, the indication that a fault has occurred, or both, to a location remote from the faulted circuit indicator.

Additional aspects, features and advantages of the invention will become apparent to those skilled in the art upon consideration of the following detailed description of illustrated embodiments exemplifying the best mode of carrying out the invention as presently perceived.

BRIEF DESCRIPTION OF THE DRAWINGS

FIG. 3 is flow chart describing an exemplary method for reporting a fault event and the state of a transmission line in accordance with FIG. 2.

FIG. 4 is a flow chart describing an exemplary method for clearing fault events and line state history in accordance with FIG. 2.

DETAILED DESCRIPTION OF EXEMPLARY EMBODIMENTS

The present invention provides a faulted circuit indicator (FCI) system capable of determining the state of a transmission line with respect to a variety of characteristics, storing the state information, and communicating the state information by means of an indicator attached to the FCI, by transmission of the information to a remote location, or both. Prior art FCIs are not capable of displaying the present state of a transmission line, nor are prior art FCIs capable of transmitting fault information and present state information relating to a transmission line to a remote location.

The FCI system is constantly attached to a transmission line, which allows electric utility companies to increase safety for line technicians, and improve their ability to diagnose and repair problems within a distribution system. The display of state information notifies a technician whether a line is energized without necessitating close contact with a transmission line. The constant monitoring of state information provides notice of conditions, such as excessive heat or vibration, that may not register as a fault on prior art FCIs, but nonetheless presents situations that require attention by the utility company, allowing for repair before a fault interrupts power for the utility company's customers. Finally, the communication of fault and state information to a remote location allows a utility company to pinpoint a fault before sending technicians out to repair the line, thus dramatically reducing the amount of time required to repair a fault.

As used herein, the term "transmission line" or "line" is intended to encompass any type of conductor that is used to transmit electricity from one location to another, but particularly refers to utility cables, whether above ground, underground, or otherwise, as are commonly used in electricity distribution systems. The term "distribution system" refers to an electricity distribution system wherein electricity generated at one or more electricity generation sites, or power plants, is transported and distributed to electricity consumers. The terms "technician" or "line technician" are interchangeably used to describe individuals whose responsibility includes locating, diagnosing, and repairing faults in transmission lines.

Figure 1:
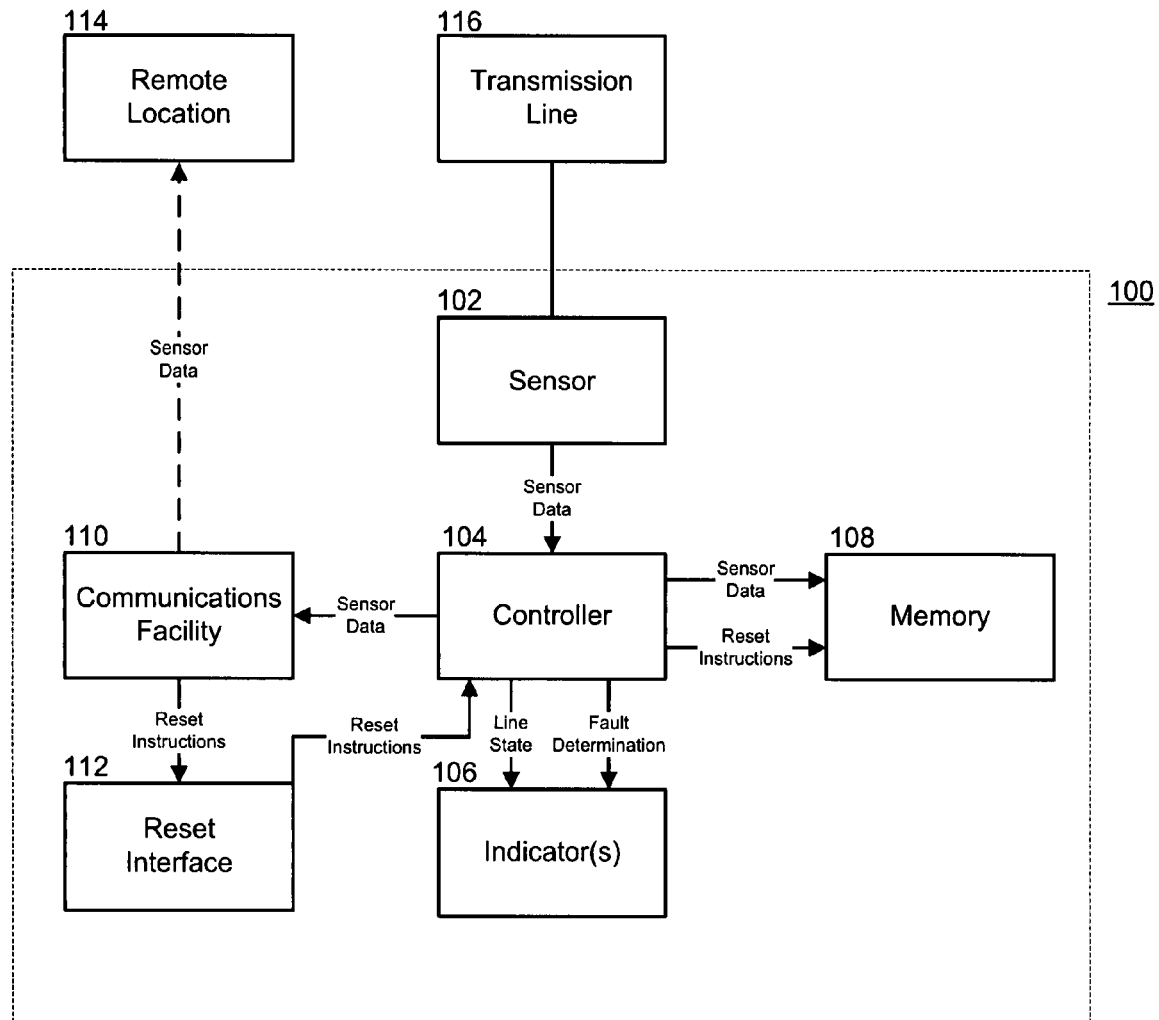
FIG. 1 is a block diagram of an FCI system according to exemplary embodiments of the present invention.

Referring now to the attached figures, in which like numerals represent like elements, certain exemplary embodiments of the present invention will hereafter be described. FIG. 1 is a block diagram of an exemplary FCI 100 system. Preferably, the FCI 100 is electrically connected to a transmission line 116. Generally, the connection between the FCI 100 and the transmission line 116 is provided by a clamping mechanism that ensures a strong connection between the FCI 100 and transmission line 116. The FCI 100 can be powered in a variety of ways. In a preferred embodiment, the FCI 100 is powered by the magnetic field generated by the transmission line 116 to which the FCI 100 is connected, along with a battery that can power the FCI 100 should current in the attached transmission line 116 be interrupted. Alternative power supplies include, but are not limited to, solar power, current passing through the transmission line 116, a rechargeable battery that harvests energy from the current in the transmission line by using a current transformer, or by utilizing the reference voltage from an energized conductor to an adjacent ground.

The FCI 100 includes a sensor 102 that measures conditions on the transmission line 116. In a preferred embodiment, the sensor 102 measures in real time the current and voltage on the transmission line 116. In an alternative embodiment, other types of sensors 102 may be used that are capable of measuring any other condition that may be present on a transmission line 116, including but not limited to temperature, tilt, wind speed, liquid levels of electrical components, the dissolved gas content and pressure associated with a monitored transformer or capacitor, and vibration. Sensor 102 can be configured to measure one or more conditions. In some embodiments, two or more sensors 102 may be combined to measure multiple conditions. The sensor 102 communicates the measurements to the controller 104 as sensor data.

The controller 104 analyzes the sensor data and takes appropriate actions. In a preferred embodiment, the controller 104 is a microcontroller programmed to analyze the sensor data and respond appropriately. In an alternative embodiment, the controller 104 may be any control mechanism capable of receiving sensor data and controlling peripheral systems such as memory 108, a communications facility 110, and an indicator 106. For example, the controller 104 could consist of any combination of analog and/or digital electronics capable of establishing that a fault event has occurred according to the described invention.

In a preferred embodiment, the controller 104 is programmed to recognize certain changes in the sensor data as fault events. For example, the controller 104 may treat a drop in current in excess of a programmed threshold as indicative of the existence of a fault. However, the controller 104 can be programmed to identify any condition that occurs on the transmission line 116 as indicative of a fault. For example, the controller 104 can be programmed to identify a surge in current or voltage in excess of a certain threshold, a temperature reading in excess of a predetermined threshold, or vibration in excess of a predefined threshold as a fault. These and other fault-indicative conditions are well known to those skilled in the relevant art. The thresholds may be defined by the utility company employing the FCI 100 in an electrical distribution system, and can vary based on conditions in a particular area. If the controller 104 determines that a fault has occurred, it can communicate that fact to one or more of the FCI's 100 indicator 106, memory 108, or communications facility 110. In an alternative embodiment, the sensor 102 may include circuitry for determining whether a fault condition has occurred and notifying the controller 104 of the fault event. In that embodiment, the controller 104 determines how to communicate the fault information.

In embodiments where the controller 104 receives sensor data from the sensor 102, the controller 104 may be further programmed to identify certain other data that may be valuable to a utility company in diagnosing problems or inefficiencies in a distribution system. The controller 104 may be configured to record data in the memory 108 for later analysis by the utility company, a line technician, or another interested party. By way of example, an increase in temperature on a transmission line 116 may not result in a fault event, but may indicate that the transmission line 116, or some of its nearby equipment, has developed a flaw that is creating additional resistance on the transmission line 116 and reducing efficiency. Because the controller 104 (and/or sensor 102) has identified the condition before a fault has occurred, the utility company can determine whether remedial action is necessary to improve the performance of the transmission system or to prevent a fault that may result in a loss of power to the utility company's customers.

The controller 104 may be further configured to communicate sensor data and fault determinations to one or more indicators 106, and optionally, to a communications facility 110. If, as described above, the controller 104 (and/or sensor 102) determines that a fault event has occurred, then the controller 104 may communicate that information to an indicator 106. Further, without regard to whether a fault event has been established, the controller 104 may communicate sensor data to the indicator 106, memory 108, or to a communications facility 110.

The indicator 106 may be a display that is mounted on the FCI 100 and situated such that it may be viewed from a distance. The indicator 106 may thus provide a visible indication that a fault has occurred. In a preferred embodiment, the indicator is a high visibility display device. However, the indicator may alternatively be a liquid crystal display (LCD) or other similar display device. Moreover, the indicator 106 may emit an audible sound that can alert a technician in the general vicinity of the FCI 100 that the FCI 100 has detected a fault condition. The audible indicator 106 may be an addition to, or an alternative to, a visible indicator 106.

The indicator 106 may also provide an indication of the state of the transmission line 116. The state of the transmission line 116 may be shown along with the indication of the fault condition on a single indicator 106, or may be shown on one or more distinct indicators 106. One or more values representing various states of the transmission line 116 may be shown on the indicator 106, or multiple indicators 106 can be used to show multiple transmission line 116 states.

In a preferred embodiment, the indicator 106 displays numeric values corresponding to the amount of current and/or voltage that is present on the transmission line 116. These numeric values are preferably provided by means of an LCD display. In an alternative embodiment, however, the values may be displayed on a series of seven-segment displays or other numeric display devices. In additional alternative embodiments, the display may use an alternative visual representation of the values, such as: a series of light emitting devices, such as light emitting diodes (LEDs), wherein a larger number of illuminated LEDs represents a greater current on the transmission line 116; a single LED, wherein the intensity of light emanating from the LED increases with the amount of current on the transmission line 116; or other similar visual representations of the magnitude of a measurement. In a further alternative embodiment, the indication of the present state of the line 116 may be audible. For example, if no current is present on the transmission line 116, the indicator 106 would remain silent, whereas the indicator 106 could emit a sound that would increase in frequency and/or pitch in relation to the amount of current present on the transmission line 116.

The memory 108 can be any standard storage device, such as flash memory or dynamic random access memory (DRAM). If the controller 104 may be programmed to determine whether sensor data represents an unusual condition or a fault, and if so, the controller 104 may record that data in the memory 108, and may optionally record the time when the unusual condition or fault occurred. In addition, the controller 104 may be programmed to record sensor data in memory 108 in response to other events, such as, but not limited to, the passage of a designated period of time.

The communications facility 110 provides a system that is capable of transmitting data to a remote location 114. The communications facility 110 may include components for any number of wireless or wired communications protocols, including, but not limited to, any of the 802.11 standards, Bluetooth, cellular technologies, ZigBee, licensed or unlicensed radio frequency communications, or power line communications technologies. The communications facility 110 provides for the communication of sensor data to a remote location 114. In a preferred embodiment, a remote location 114 is a central utility office having the capability of monitoring communication feeds from numerous FCIs 100 simultaneously. Alternatively, the remote location 114 may be a mobile unit, such as a personal digital assistant (PDA) or mobile computer carried by a technician that is capable of receiving sensor data from the communications facility 110 without the technician coming into direct physical contact with the FCI 100.

The reset interface 112 may have two distinct reset instructions: an indicator reset and a memory reset. The indicator reset instruction removes the fault indication, while the memory reset instruction clears sensor data from the memory 108. While both the indicator reset and the memory reset instructions may be triggered by the same event, in some instances, it may be preferable to reset one or the other in isolation.

For example, in a preferred embodiment, the controller 104 may be programmed to respond to the resumption of proper current flow after a fault event by issuing an indicator reset instruction but not a memory reset instruction. In this mode of operation, a record of the fault event, as well as the conditions that accompanied the event will remain in memory 108 even though the fault indicator 106 has been cleared. The information may then be downloaded from the memory 108 and analyzed, and the FCI 100 will not indicate a fault situation when none presently exists. Thus, the present invention may provide automatic reset when proper current flow resumes, while also storing data that can be used to diagnose and locate transient or intermittent faults.

Further, the reset interface 112 may receive reset instructions from the remote location 114 via the communications facility 110. This mode of operation allows a technician or other utility company employee to reset the fault indication, the memory 108, or both, without directly contacting the FCI 100. The reset interface 112 may also receive reset instructions directly from a technician. In a preferred embodiment, the technician provides reset instructions by activating one or more buttons on the FCI 100. In an alternative embodiment, reset instructions may be provided via switches or other common input techniques.

In a preferred embodiment, the sensor 102, controller 104, memory 108, communications facility 110, and reset interface 112 are all provided inside a weatherproof housing, while the indicator 106 is disposed on the outer surface of the housing such that the indicator 106 can be viewed from a distance. In alternative embodiments, however, each component may be disposed either inside or outside the housing. The housing is preferably clamped to a transmission line 116 with a clamping mechanism as described in U.S. Pat. No. 5,497,096, and the sensor 102 is logically coupled to a conductive portion of the clamping mechanism.

Figure 2:
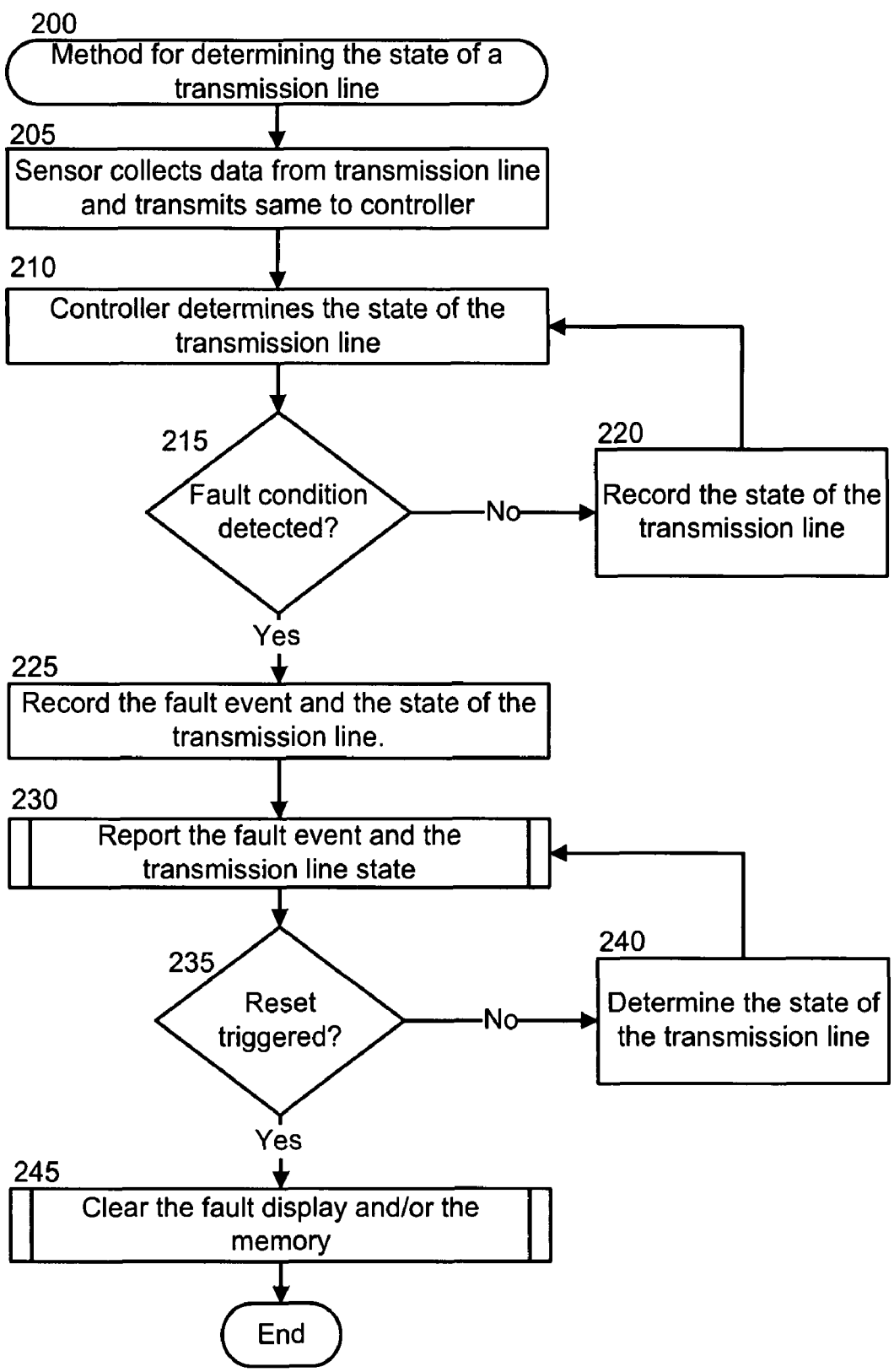
FIG. 2 is a flow chart describing an exemplary method for determining the state of a transmission line using the FCI of FIG. 1.

FIG. 2 is a flow chart describing a method for determining the state of a transmission line 116 with an FCI 100 according to an exemplary embodiment of the invention. The method 200 will be described with respect to FIG. 1.

The method 200 assumes that the sensor 102 of the FCI 100 is connected to a transmission line 116. In step 205, the sensor 102 collects data from the transmission line 116 and transmits it to the controller 104. In step 210, the controller 104 determines the state of the transmission line 116 in real time or near real time, based on sensor data. In step 215, the controller 104 determines whether the sensor has detected a fault on the transmission line 116. If no fault condition has been detected, the method branches to step 220, and optionally records the state of the transmission line 116. As described above with respect to the memory 108, the state of the transmission line 116 may be recorded as a matter of course, or based on the occurrence of a condition, such as when the state represents an unusual condition, or a certain period of time has lapsed. The method then returns to step 210 and the controller 104 continues to determine the state of the transmission line 116.

If the controller 104 in step 215 determines that a fault condition has occurred, then the method 200 branches to step 225, wherein the controller 104 records the fault event and the state of the transmission line 116. In step 230, the FCI 100 reports the fault event and the transmission line state. The FCI 100 may report the event and state by means of both the indicator 106 and the communications facility 110, as will be described in further detail with respect to FIG. 3.

In step 235, the controller 104 determines whether a reset has been triggered. If no reset has been triggered, the method proceeds to step 240, where the controller 104 continues to determine the state of the transmission line 116, and then returns to step 230, wherein the state of the transmission line 116 and the fault event are reported. The method will continue looping through steps 230, 235, and 240 until a reset is triggered. If, in step 235, a reset event is triggered, the method proceeds to step 245 wherein the controller 104 may clear the fault indication, the memory 108, or both. The reset procedure is discussed in further detail with respect to FIG. 4.

FIG. 3 is a flow chart describing a method for reporting a fault event or the state of a transmission line 116 according to an exemplary embodiment of the invention, as referred to in step 230 of FIG. 2. The exemplary method 230 will be described with respect to FIGS. 1 and 2.

In step 305, the indicator 106 displays a notification that a fault has occurred. As described above, the notification can be visual, audible, or both. In step 310 the indicator 106 displays the present state of the transmission line 116, as determined in step 240.

In step 315, the controller 104 determines whether remote communications are desired. In an exemplary embodiment, the controller 104 determines whether a communications facility 110 is present in the FCI 100. The controller 104 then determines based on its programming whether to communicate the fault event or transmission line state via the communications facility 110. In some situations, it may be desirable to always transmit a fault event, but never to transmit line state. In other situations, it may be desirable to transmit both the line state and the fault event. If the controller 104 determines not to communicate the fault event or the transmission line state, the method for reporting a fault event terminates and returns to step 235 of FIG. 2.

If, however, the controller 104 in step 315 determines that a communications facility 110 is present and that remote communications are desired, the method branches to step 320, wherein the communications facility 110 transmits information to the remote location 114. As described above with respect to FIG. 1, the transmission may use one or more communication methods. For example, if the controller 104 is to transmit both fault information and line state information, in an exemplary embodiment, the communications facility 110 may transmit the fault information using one or more communication protocols appropriate for long range communications to a remote base station, such as, but not limited to, the central office of a utility company. Simultaneously, the controller 104 may transmit fault information and line state over a protocol more appropriate for short range communications, such as Bluetooth. Thus, the central office would receive notice of the fault and information that would identify the fault's location, which would reduce the time required to identify a faulted transmission line 116. Simultaneously, technicians could receive fault and line state information on handheld devices that would allow the technicians to verify whether an FCI 100 registered a fault, and whether the transmission line 116 was energized, all from a convenient handheld device without coming into direct contact with the transmission line 116. After the FCI 100 has reported the fault condition and state of the transmission line 116, the method proceeds to step 235 of FIG. 2.

FIG. 4 is a flow chart describing a method for clearing fault events and line state history according to an exemplary embodiment of the invention, as referred to in step 245 of FIG. 2. The method 245 will be described with respect to FIGS. 1 and 2.

In step 405, the controller 104 determines, based on its programming, whether the reset signal should clear the FCI's 100 history. As described above, a variety of events may trigger a reset, and a utility company may desire to have some events reset the FCI's 100 history, while others reset only the fault indication. If the controller 104 determines that the received reset signal should not reset the FCI's 100 memory 108, then the method proceeds to step 415.

If, however, the controller 104 determines that the received reset signal should reset the FCI's 100 memory 108, then the method proceeds to step 410, wherein the controller 104 clears historical data from the FCI's 100 memory 108. After clearing the memory 108, the method branches to step 415. In step 415, the controller 104 determines whether the reset signal should clear the FCI's 100 fault indicator 106. If the controller 104 determines that the received reset signal should not reset the FCI's 100 fault indicator 106, then the method terminates. If the controller 104 determines that the received reset signal should reset the fault indicator 106, the method branches to step 420, wherein the controller 104 clears any indication that a fault has occurred from the FCI's 100 fault indicator 106. After clearing the fault indication, the method terminates.

Figure 5:
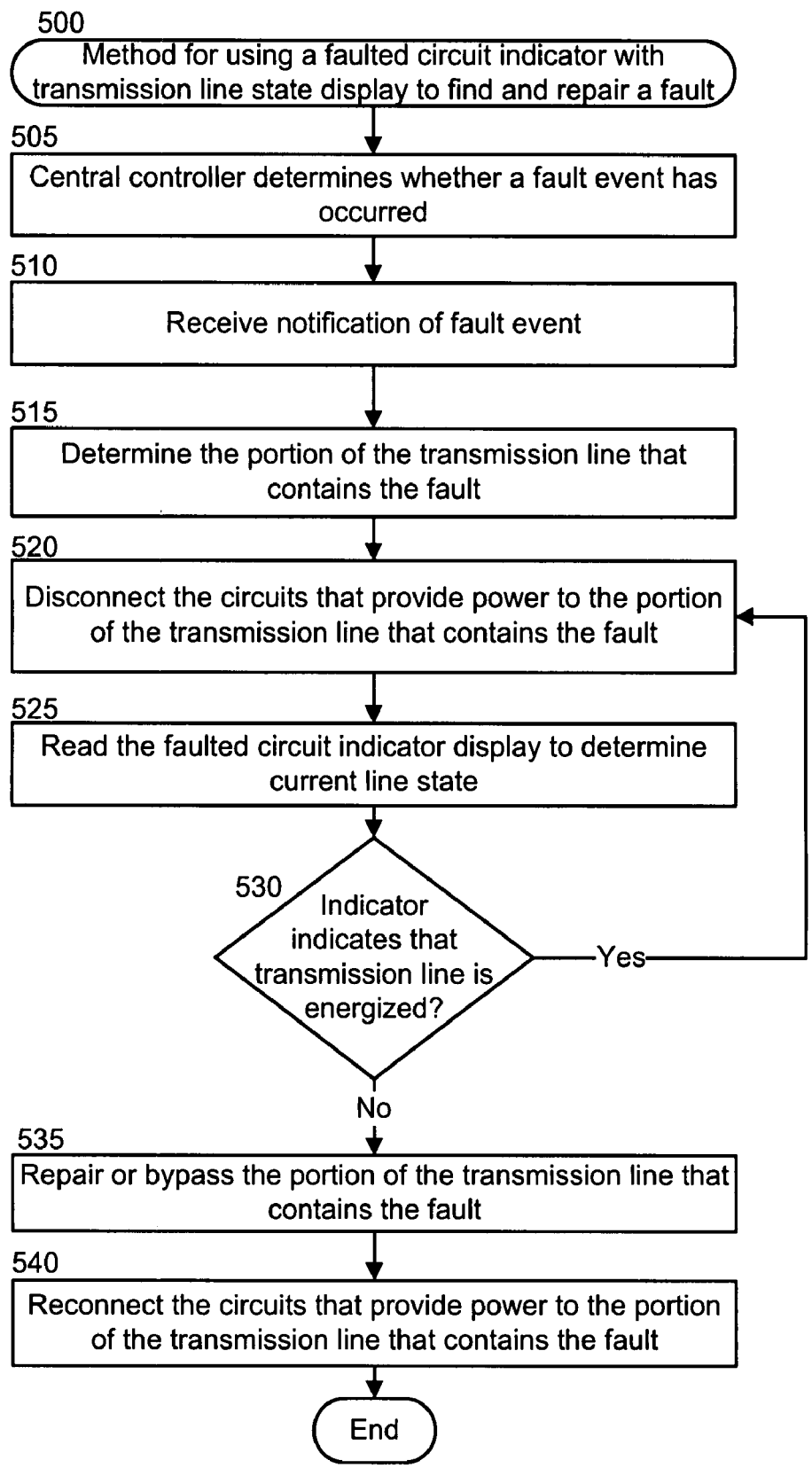
FIG. 5 is a flow chart describing an exemplary method for using a faulted circuit indicator with transmission line state display to find and repair a transmission line having a fault.

FIG. 5 is a flow chart describing a method for using a faulted circuit indicator with transmission line state display to find and repair a transmission line 116 having a fault. The method 500 will be described with respect to FIG. 1.

The exemplary method 500 assumes that the sensor 102 of the FCI 100 is connected to a transmission line 116. In a preferred embodiment, the sensor 102 is connected to the transmission line 116 via the clamping mechanism that attaches the FCI 100 to the transmission line 116. In step 505, the controller 104 determines whether a fault event has occurred. In a preferred embodiment, the controller 104, in accordance with the method described in FIG. 2, will provide notification that a fault event has been detected, either via the indicator 106, the communications facility 110, or both.

In step 510, notification of the occurrence of the fault event is received by the utility company or other entity responsible for maintaining the integrity of the transmission line 116 to which the FCI 100 is attached. In a preferred embodiment, as described above, the notification is received via the indicator 106 or communications facility 110. Alternatively, however, the notification can be received in a variety of other ways. For example, notice of the fault event may be received from a customer of the electrical utility who calls to complain about a service interruption.

Once notice of the fault event is received, in step 515 the electrical utility determines the portion of the transmission line 116 that contains the fault. As described above, the faulted portion of the transmission line 116 will typically be located between the first FCI 100 that indicates a fault and the last FCI 100 that does not indicate a fault. In a preferred embodiment, the faulted portion of the transmission line 116 is determined at the home office by identifying the FCIs 100 throughout the system that are broadcasting via their respective communications facilities 110 that a fault event has occurred. Alternatively, the determination of the faulted portion of the transmission line 116 can be made by line technicians, who, based on a report of an interruption in electrical power, examine the transmission lines 116 servicing the interrupted area to find the first FCI 100 displaying an indication that a fault has occurred on its indicator 106. Once the faulted portion of transmission line 116 has been determined, if a repair is to be undertaken, line technicians proceed to the faulted portion of the transmission line 116.

In step 520, the line technicians proceed to cut power to the portion of the transmission line 116 to be repaired, typically by disconnecting any feeder circuits. However, because, as described above, multiple circuits may feed a particular transmission line 116, simply switching off nearby feeder circuits may not stop the flow of current into the portion of the transmission line 116 to be repaired.

In step 525, the line technician may read the display on the faulted circuit indicator to determine whether current is present on the transmission line 116. In step 530, if the display indicates that the transmission line 116 is still energized, the line technician will be made aware that work may not be performed on the line 116 at present, and the method branches to step 520, and the technician continues to disconnect feeder circuits.

If, however, in step 530, the indicator 106 indicates that the transmission line 116 is no longer energized, the method branches to step 535, wherein the line technician repairs or bypasses the portion of line 116 determined in step 515 to contain the fault. In step 540, the line technician then reconnects any circuits that previously provided power to the faulted portion of the transmission line 116. After reconnecting the circuits, the method ends.

Based on the foregoing, it can be seen that the present invention provides a faulted circuit indicator apparatus having an indicator that can display the present state of a transmission line. The present invention also provides a method for determining the state of a transmission line with a faulted circuit indicator, as well as a method for using a faulted circuit indicator with transmission line state display for safely repairing faulted transmission lines. Many other modifications, features and embodiments of the present invention will become evident to those of skill in the art. It should be appreciated, therefore, that many aspects of the present invention were described above by way of example only and are not intended as required or essential elements of the invention unless explicitly stated otherwise. Accordingly, it should be understood that the foregoing relates only to certain embodiments of the invention and that numerous changes may be made therein without departing from the spirit and scope of the invention as defined by the following claims. It should also be understood that the invention is not restricted to the illustrated embodiments and that various modifications can be made within the scope of the following claims.

What is claimed is:

1. A method for repairing a transmission line in an electrical power distribution system comprising a transmission line having at least one feeder line and a plurality of faulted circuit indicators connected to the transmission line, wherein each of the faulted circuit indicators comprises a housing disposed at the transmission line, a fault indicator disposed at the housing for indicating whether a fault condition has occurred on the transmission line and a display disposed at the housing for indicating a state of the transmission line, the method comprising the steps of:

determining from a first faulted circuit indicator whether the fault condition has occurred;

determining from a fault indicator disposed at the housing of the first faulted circuit indicator and a fault indicator disposed at the housing of at least a second faulted circuit indicator a portion of the transmission line on which the fault condition has occurred;

disconnecting the transmission line from a first feeder line;

determining the state of the transmission line from the display disposed at the housing of the first faulted circuit indicator, wherein the state of the transmission line comprises at least one of a current, a voltage, a temperature, or a vibration present on the transmission line; and repairing the transmission line if the display disposed at the housing of the first faulted circuit indicator indicates that the state of the transmission line is such that it is safe to do so.

2. The method of claim 1, wherein the state of the transmission line comprises a current level present on the transmission line, and the display indicates that the state of the transmission line is such that it is safe to repair, if the current level is less than a current threshold.

3. The method of claim 1, further comprising the step of disconnecting the transmission line from additional feeder lines, if the display of the first faulted circuit indicator indicates that the state of the transmission line is such that it is not safe to repair the transmission line.

4. The method of claim 1, wherein the step of determining the state of the transmission line from the display disposed at the housing of the first faulted circuit indicator further comprises reading a numeric representation of the state of the transmission line from the display.

5. The method of claim 1, wherein
each of the faulted circuit indicators further comprises a communications facility for communicating indications of whether the fault condition has occurred to a remote location, and
the step of determining from the first faulted circuit indicator whether the fault condition has occurred further comprises receiving at the remote location an indication from the first faulted circuit indicator that the fault condition has occurred.

6. The method of claim 5, wherein the step of determining from the fault indicator disposed at the housing of the first faulted circuit indicator and the fault indicator disposed at the housing of the at least second faulted circuit indicator the portion of the transmission line on which the fault condition has occurred further comprises receiving at the remote location an indication from the at least second faulted circuit indicator that the fault has not occurred.

7. The method of claim 1, wherein
each of the faulted circuit indicators further comprises a communications facility for communicating data relating to the state of the transmission line to a remote location, and
the step of determining the state of the transmission line further comprises receiving the data relating to the state of the transmission line at the remote location.

8. The method of claim 1, wherein each fault indicator is disposed on an outer surface of a housing of a respective faulted circuit indicator.

9. The method of claim 1, wherein each display is disposed on an outer surface of a housing of a respective faulted circuit indicator.

10. The method of claim 1, wherein the display of each faulted circuit indicator displays a numerical representation of a voltage present on the transmission line and a numerical representation of a current present on the transmission line.

* * * * *